United States Patent
Izumi

(10) Patent No.: US 9,236,745 B2
(45) Date of Patent: Jan. 12, 2016

(54) VEHICLE CONTROL DEVICE AND VEHICLE CONTROL METHOD

(75) Inventor: Junta Izumi, Nagoya (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 128 days.

(21) Appl. No.: 13/811,437

(22) PCT Filed: Jul. 20, 2011

(86) PCT No.: PCT/IB2011/001692
§ 371 (c)(1),
(2), (4) Date: Jan. 22, 2013

(87) PCT Pub. No.: WO2012/010955
PCT Pub. Date: Jan. 26, 2012

(65) Prior Publication Data
US 2013/0124029 A1    May 16, 2013

(30) Foreign Application Priority Data

Jul. 23, 2010   (JP) .................................. 2010-165485

(51) Int. Cl.
*H02J 7/00* (2006.01)
*B60K 6/445* (2007.10)
(Continued)

(52) U.S. Cl.
CPC . *H02J 7/00* (2013.01); *B60K 6/445* (2013.01); *B60L 3/0038* (2013.01); *B60L 11/123* (2013.01);
(Continued)

(58) Field of Classification Search
CPC ............. H02J 7/042; H02J 7/045; H02J 7/00; B60L 11/1809; B60L 11/185; B60W 10/26; B60W 20/106; G01R 19/165; G01R 19/16542; G01R 31/362; G01R 31/3624; H01M 10/44
USPC ...................... 701/22; 320/132, 104, 130, 134
See application file for complete search history.

(56) References Cited

U.S. PATENT DOCUMENTS

| 8,036,787 B2 * | 10/2011 | Izumi et al. .................. 701/33.7 |
| 8,116,915 B2 * | 2/2012 | Kempton ...................... 700/291 |

(Continued)

FOREIGN PATENT DOCUMENTS

| CN | 101516828 | 12/2009 |
| JP | 2003-9415 | 1/2003 |

(Continued)

*Primary Examiner* — John Q Nguyen
*Assistant Examiner* — Nadeem Odeh
(74) *Attorney, Agent, or Firm* — Finnegan, Henderson, Farabow, Garrett & Dunner, LLP

(57) ABSTRACT

A control for a vehicle including a battery, an auxiliary load, an electric power controller controlling electric power exchanged between the battery and the auxiliary load and a charger charging the battery using a power supply outside the vehicle includes: during vehicle drive control, controlling the electric power controller so that an SOC falls within a predetermined range; when the power supply is connected to the vehicle, controlling the electric power controller and the charger so as to carry out extended charging in which a variation in the SOC during the external charging is larger than a width of the predetermined range that is a control range from a control lower limit value to a control upper limit value during drive control; and calculating the full charge capacity by multiplying a ratio of a maximum value of the SOC to a variation in the SOC during the extended charging by an accumulated value of current flowing into the battery during the extended charging.

7 Claims, 7 Drawing Sheets

(51) Int. Cl.
  *B60L 3/00* (2006.01)
  *B60L 11/12* (2006.01)
  *B60L 11/14* (2006.01)
  *B60L 11/18* (2006.01)
  *B60W 10/26* (2006.01)
  *B60W 20/00* (2006.01)
  *G01R 31/36* (2006.01)

(52) U.S. Cl.
  CPC ............. *B60L 11/14* (2013.01); *B60L 11/1816* (2013.01); *B60L 11/1862* (2013.01); *B60L 11/1868* (2013.01); *B60W 10/26* (2013.01); *B60W 20/106* (2013.01); *B60L 2210/12* (2013.01); *B60L 2240/12* (2013.01); *B60L 2240/545* (2013.01); *B60L 2240/547* (2013.01); *B60L 2240/549* (2013.01); *B60W 2710/244* (2013.01); *G01R 31/361* (2013.01); *Y02T 10/6217* (2013.01); *Y02T 10/6239* (2013.01); *Y02T 10/6269* (2013.01); *Y02T 10/7005* (2013.01); *Y02T 10/7044* (2013.01); *Y02T 10/7066* (2013.01); *Y02T 10/7077* (2013.01); *Y02T 10/7233* (2013.01); *Y02T 90/127* (2013.01); *Y02T 90/14* (2013.01)

(56) References Cited

U.S. PATENT DOCUMENTS

| | | | |
|---|---|---|---|
| 2003/0001541 | A1 | 1/2003 | Ueda et al. |
| 2008/0238371 | A1 | 10/2008 | Tamezane |
| 2009/0015201 | A1 | 1/2009 | Fukumura et al. |
| 2009/0288896 | A1 | 11/2009 | Ichikawa |
| 2010/0010707 | A1* | 1/2010 | Izumi et al. ............... 701/35 |

FOREIGN PATENT DOCUMENTS

| | | |
|---|---|---|
| JP | 2003-79059 | 3/2003 |
| JP | 2003-134678 | 5/2003 |
| JP | 2005-83970 | 3/2005 |
| JP | 2007-223462 | 9/2007 |
| JP | 2008-241358 | 10/2008 |
| JP | 2010-130798 | 6/2010 |

* cited by examiner

VEHICLE CONTROL DEVICE AND VEHICLE CONTROL METHOD

CROSS-REFERENCE TO RELATED APPLICATIONS

This application is a national phase application of International Application No. PCT/IB2011/001692, filed Jul. 20, 2011, and claims the priority of Japanese Application No. 2010-165485, filed Jul. 23, 2010, the content of both of which is incorporated herein by reference.

BACKGROUND OF THE INVENTION

1. Field of the Invention

The invention relates to control over a vehicle and, more particularly, to charging and discharging control over a battery equipped for a vehicle.

2. Description of Related Art

In recent years, hybrid vehicles and electric vehicles (hereinafter, these are collectively referred to as electromotive vehicles) are practically used. An electromotive vehicle uses a battery, an inverter and a motor that is driven by the inverter, as a power source. In such an electromotive vehicle, usually, charging and discharging of the battery are controlled so that a state quantity (hereinafter, also simply referred to as "SOC") that indicates the state of charge of the battery falls within a constant range. It is known that, when charging and discharging are repeated within such a constant range, there occurs a deviation between an estimated SOC and an actual SOC, a decrease in charging and discharging capacity due to a so-called memory effect, degradation due to sulfation, or the like. It is known that these problems may be eliminated by bringing the battery close to a full charge or a complete discharge (so-called refreshing).

Japanese Patent Application Publication No. 2007-223462 (JP-A-2007-223462) describes a technique that reliably refreshes a battery. A control device described in JP-A-2007-223462, in a hybrid vehicle that is connectable to an external power supply, carries out refresh discharging of the battery before charging the battery from the external power supply, and charges the battery from the external power supply after the battery has been subjected to refresh discharging.

Incidentally, it is possible to estimate the full charge capacity of the battery using an SOC variation amount and accumulated current value during charging (the amount of charge flowing into the battery). That is, by multiplying the ratio of an SOC maximum value to the SOC variation amount (which is expressed by SOC maximum value/SOC variation amount, and is a value larger than 1) by the accumulated current value, it is possible to estimate the amount of charge corresponding to the SOC maximum value, that is, the full charge capacity of the battery.

If the full charge capacity is estimated by the above method, it is presumable that the estimate accuracy of the full charge capacity deteriorates when the SOC variation amount during charging cannot be sufficiently ensured. That is, the accumulated current value during charging is calculated on the basis of an output from a current sensor; however, the output from the current sensor contains an error. Therefore, when the SOC variation amount is small, the rate of amplifying the accumulated current value (=SOC maximum value/SOC variation amount) at the time of estimating the full charge capacity increases, so an error contained in the estimated full charge capacity is also amplified accordingly.

However, JP-A-2007-223462 does not describe anything about the above problem or a solution thereof.

SUMMARY OF THE INVENTION

The invention provides a control device and control method that, in a vehicle equipped with a battery that is chargeable using a power supply outside the vehicle, accurately estimate the full charge capacity of the battery.

A first aspect of the invention relates to a control device for a vehicle that includes a battery, an auxiliary bad, an electric power controller that controls electric power exchanged between the battery and the auxiliary bad and a charger that carries out external charging in which the battery is charged using a power supply outside the vehicle. The control device includes: a first control unit that, during drive control of the vehicle, controls the electric power controller so that an SOC that is a ratio of an actual amount of charge to a full charge capacity of the battery falls within a predetermined range; a second control unit that, when the power supply is connected to the vehicle, controls the electric power controller and the charger so as to carry out extended charging in which a variation in the SOC during the external charging is larger than a width of the predetermined range that is a control range from a control lower limit Value to a control upper limit value during drive control. For example, a variation in the SOC during the external charging is between a predetermined charging start value and a predetermined charging end value. The predetermined charging start value is lower than the control lower limit value, and the predetermined charging end value is higher than the control upper limit value. The control device also includes a calculating unit that calculates the full charge capacity by multiplying a ratio of a maximum value of the SOC to a variation in the SOC during the extended charging by an accumulated value of current flowing into the battery during the extended charging.

In the control device, when the power supply is connected to the vehicle, the second control unit may carry out first discharging in which the battery is discharged until the SOC decreases to a first SOC that falls within a first range lower than a lower limit value of the predetermined range, may start the extended charging after the first discharging is ended, and may end the extended charging at the time when the SOC has reached a second SOC that falls within a second range higher than an upper limit value of the predetermined range.

In the control device, the second control unit may carry out second discharging in which, after the extended charging Is ended, the battery is discharged so that the SOC falls within the predetermined range.

In the control device, the battery may have a characteristic such that a variation in the SOC with respect to a unit variation in voltage of the battery in the first and second ranges is smaller than a variation in voltage of the SOC with respect to a unit variation in voltage of the battery in the predetermined range, the control device may further include a voltage sensor that detects a voltage of the battery, and the calculating unit may calculate an SOC at the time when the extended charging is started on the basis of an output from the voltage sensor at the time when the extended charging is started, may calculate an SOC at the time when the extended charging is ended on the basis of an output from the voltage sensor at the time when the extended charging is ended, and may calculate a difference between the calculated two values of SOC as a variation in the SOC during the extended charging.

In the control device, the second control unit may establish a state where no current is flowing through the battery during a first period after the first discharging is ended and before the extended charging is started, and may establish a state where no current is flowing through the battery during a second period after the extended charging is ended and before the second discharging is started, the control unit may further include a correlation storage unit that prestores a voltage of the battery and the SOC in a state where no current is flowing through the battery, and the calculating unit may calculate an SOC corresponding to an output from the voltage sensor in the first period using the correlation as an SOC at the time when the extended charging is started, may calculate an SOC corresponding to an output from the voltage sensor in the second period using the correlation as an SOC at the time when the extended charging is ended, and may calculate a variation in the SOC during the extended charging.

In the control device, the second control unit may determine whether it is allowed to carry out the extended charging on the basis of a usage history of the vehicle when the power supply is connected to the vehicle, may carry out the extended charging when it is determined that it is allowed to carry out the extended charging, and may carry out normal charging in which the external charging is ended at the time point at which the SOC has reached an upper limit value of the predetermined range when it is determined that it is not allowed to carry out the extended charging.

In the control device, the second control unit may determine whether it is allowed to carry out the extended charging when time at which the power supply is connected to the vehicle falls within midnight hours and it has been detected that a position at which the vehicle is stopped is a home of a driver of the vehicle, may carry out the extended charging when it is determined that it is allowed to carry out the extended charging, and may carry out normal charging in which the external charging is ended at the time when the SOC has reached an upper limit value of the predetermined range when it is determined that it is not allowed to carry out the extended charging.

The control device may further include a capacity storage unit that stores the full charge capacity calculated by the calculating unit, and the first control unit may use the full charge capacity stored in the capacity storage unit to calculate the SOC during the drive control.

A second aspect of the invention relates to a control method for a vehicle that includes a battery, an auxiliary load, an electric power controller that controls electric power exchanged between the battery and the auxiliary load and a charger that carries out external charging in which a power supply outside the vehicle is used to charge the battery. The control method includes: during drive control of the vehicle, controlling the electric power controller so that an SOC that is a ratio of an actual amount of charge to a full charge capacity of the battery falls within a predetermined range; when the power supply is connected to the vehicle, controlling the electric power controller and the charger so as to carry out extended charging in which a variation in the SOC during the external charging is larger than a width of the predetermined range; and calculating the full charge capacity by multiplying a ratio of a maximum value of the SOC to a variation in the SOC during the extended charging by an amount of charge flowing into the battery during the extended charging.

According to the first and second aspects of the invention, in a vehicle equipped with a battery that may be charged using a power supply outside the vehicle, it is possible to accurately estimate the full charge capacity of the battery.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
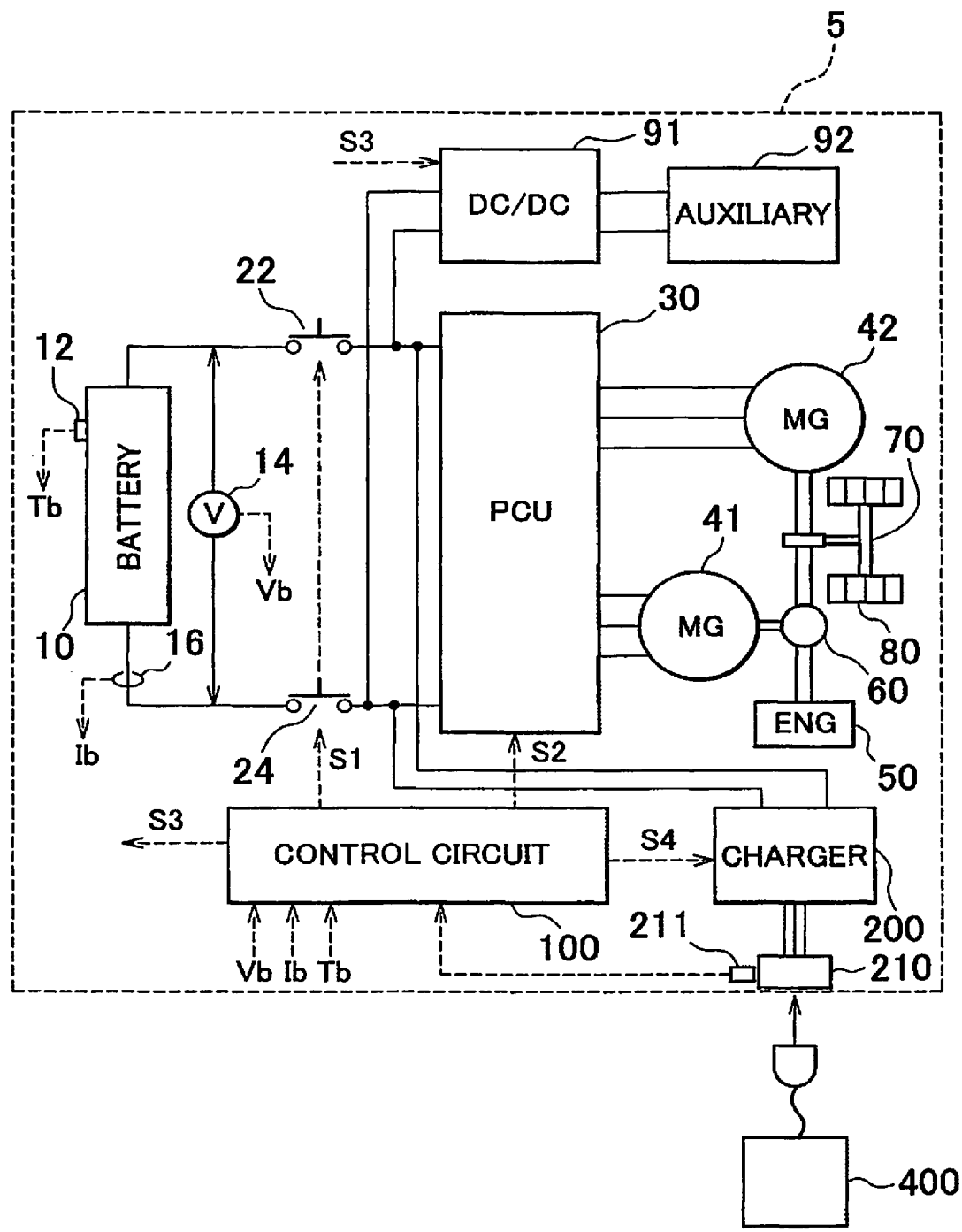
FIG. 1 is a block diagram that illustrates the schematic configuration of a vehicle.

Hereinafter, an embodiment of the invention will be described in detail with reference to the accompanying drawings. Note that like reference numerals denote the same or corresponding components in the drawings and the description thereof is basically not repeated.

FIG. 1 is a block diagram that illustrates the schematic configuration of a vehicle 5 equipped with a control device according to the embodiment of the invention. Note that the vehicle 5 shown in FIG. 1 is a hybrid vehicle; however, the aspect of the invention is not limited to a hybrid vehicle, but it may be applied to all electromotive vehicles.

As shown in FIG. 1, the vehicle 5 includes a battery 10, system main relays (SMRs) 22 and 24, a power control unit (PCU) 30, motor generators (MGs) 41 and 42, an engine 50, a power split mechanism 60, a drive shaft 70, wheels 80 and a control circuit 100.

The battery 10 is a chargeable and dischargeable battery, and is, for example, formed so that a plurality of secondary battery cells, such as nickel metal hydride batteries and lithium ion batteries, are connected in series. The battery 10 outputs a high voltage (for example, about 200 volts) for driving the MGs 41 and 42.

The engine 50 outputs kinetic energy using the combustion energy of fuel. The power split mechanism 60 is coupled to the output shafts of the MGs 41 and 42 and engine 50, and drives the drive shaft 70 by the output power of the MG 42 and/or the output power of the engine 50. Then, the wheels 80 are rotated by the drive, shaft 70. In this way, the vehicle 5 is propelled by the output power of the engine 50 and/or the output power of the MG 42.

The MGs 41 and 42 are able to function as not only a generator but also an electric motor. The MG 41 is used as a starter that starts the engine 50 at the time of an engine start request, such as at the time of acceleration. At this time, the MG 41 is driven as an electric motor with electric power supplied from the battery 10 via the PCU 30 to crank the engine 50 to thereby start the engine 50. Furthermore, after the start of the engine 50, the MG 41 is rotated by the engine power output transmitted via the power split mechanism 60 to be able to generate electric power.

The MG 42 is driven by at least one of electric power stored in the battery 10 and electric power generated by the MG 41. The driving force of the MG 42 is transmitted to the drive shaft 70. By so doing, the MG 42 assists the engine 50 to drive the vehicle 5 or uses only its own driving force to drive the vehicle 5. In addition, during regenerative braking of the vehicle 5, the MG 42 is driven by the rotational force of the wheels to operate as a generator. At this time, regenerative electric power generated by the MG 42 is transmitted to the battery 10 via the PCU 30 to charge the battery 10.

The SMRs 22 and 24 are provided between the PCU 30 and the battery 10. The SMRs 22 and 24 are turned on or off in response to a control signal S1 from the control circuit 100. When the SMRs 22 and 24 are turned off (open), a path for charging and discharging the battery 10 is mechanically interrupted.

The PCU 30 carries out bidirectional voltage conversion and electric power conversion between the battery 10 and the MGs 41 and 42 in response to a control signal S2 from the control circuit 100, and causes the MGs 41 and 42 to operate in accordance with respective operation command values (typically, torque command values).

Furthermore, the vehicle 5 includes a DC/DC converter 91 and an auxiliary 92. The DC/DC converter 91 is connected to the battery 10 in parallel with the PCU 30, and steps down direct-current voltage supplied from the battery 10 on the basis of a control signal S3 from the control circuit 100. The stepped-down electric power is supplied to the auxiliary 92. Note that the auxiliary 92, for example, includes loads, such as lamps, a wiper, a heater, an audio and an air conditioner, and an auxiliary battery that outputs a voltage (for example, about 12 V) lower than the voltage between both ends of the battery 10.

Furthermore, the vehicle 5 includes a connector 210, a connection sensor 211 and a charger 200. The vehicle 5 is a so-called plug-in vehicle, and is able to charge the battery 10 with electric power from an external power supply 400 provided outside the vehicle. The connector 210 is configured to be connectable to the external power supply 400. The charger 200 is provided between the battery 10 and the connector 210. The charger 200 converts alternating-current electric power, supplied from the external power supply 400, to direct-current electric power, with which the battery 10 may be charged, on the basis of a control signal S4 from the control circuit 100, and then supplies the battery 10 with the direct-current electric power. When the external power supply 400 is connected to the connector 210, the connection sensor 211 outputs a signal, which indicates that the external power supply 400 is connected to the vehicle 5, to the control circuit 100.

Furthermore, the vehicle 5 includes a temperature sensor 12, a voltage sensor 14 and a current sensor 16. The temperature sensor 12 detects the temperature (battery temperature) Tb of the battery 10.

The current sensor 16 detects the current (battery current) Ib that flows through the battery 10. In the following description, it is defined that the battery current Ib is positive during discharging of the battery 10, and the battery current Ib is negative during charging of the battery 10.

The voltage sensor 14 detects the voltage (battery voltage) Vb between both ends of the battery 10. Note that the battery 10 generally has an internal resistance R. Because of the influence of the internal resistance R, the battery voltage Vb varies depending on whether current is flowing through the battery 10. In the following description, the battery voltage Vb in a state where no current is flowing through the battery 10 is termed "battery voltage OCV" or simply termed "OCV" (open circuit voltage), and the battery voltage Vb in a state where current is flowing through the battery 10 is termed "battery voltage CCV" or simply termed "CCV" (closed circuit voltage). In addition, when it is not necessary to distinguish the battery voltages OCV and CCV from each other, it is simply termed "battery voltage Vb", Note that the relational expression CCV=OCV−Ib×R theoretically holds between the battery voltages OCV and CCV.

The results detected by the temperature sensor 12, the voltage sensor 14 and the current sensor 16 are transmitted to the control circuit 100.

The control circuit 100 is formed of an electronic control unit (ECU) that incorporates a central processing unit (CPU) (not shown) and a memory (not shown). The control circuit 100 executes predetermined processing on the basis of the results detected by the sensors, information stored in the memory, and the like, generates the control signals S1 to S4 depending on the result, and outputs the control signals S1 to S4 respectively to the SMRs 22 and 24, the PCU 30, the DC/DC converter 91 and the charger 200. Note that the engine 50 is controlled by another ECU (not shown), In addition, in FIG. 1, the control circuit 100 is shown as a single unit; instead, the control circuit 100 may be formed of two or more separate units.

Figure 2:
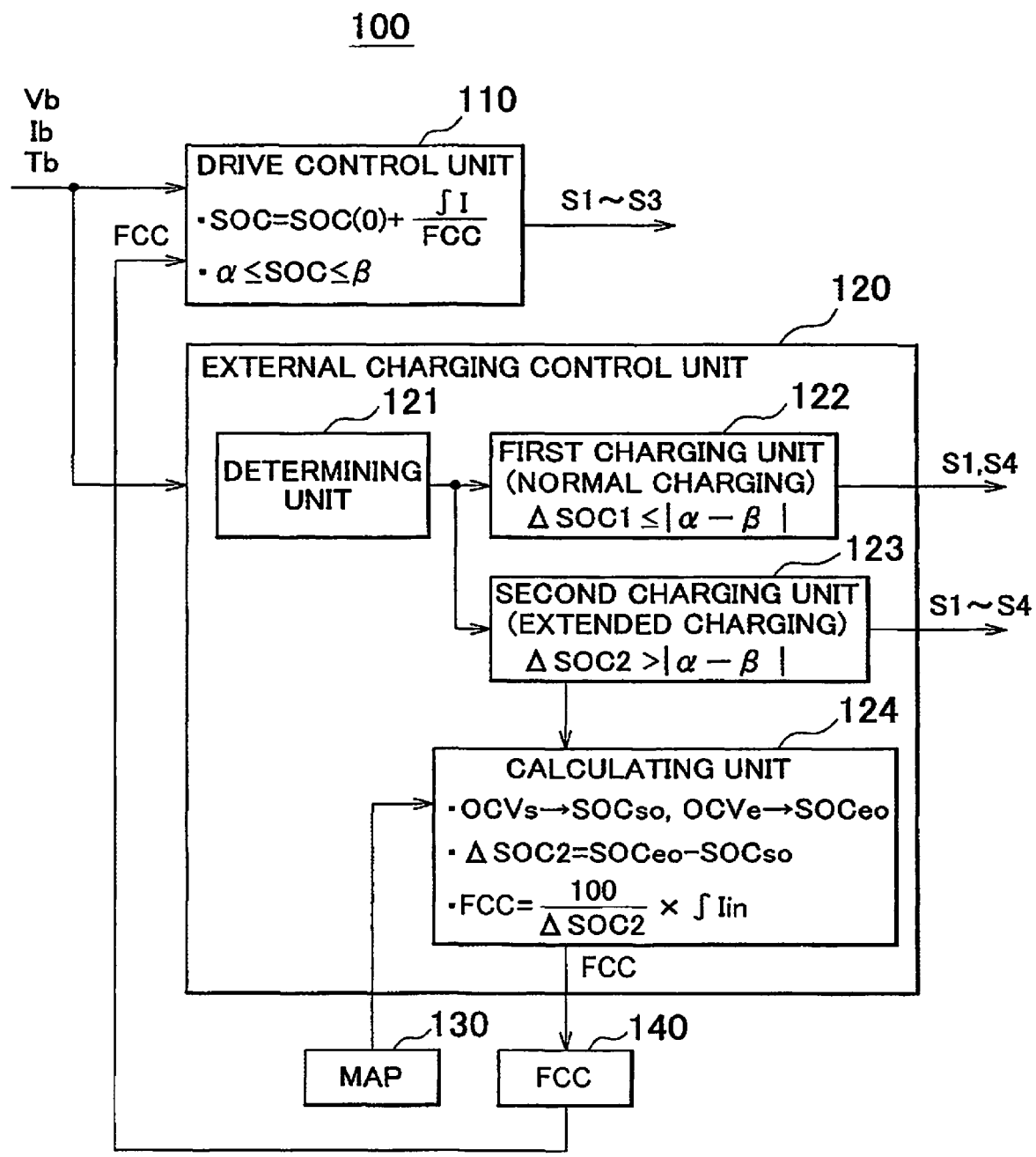
FIG. 2 is a functional block diagram of a control circuit.

FIG. 2 is a functional block diagram of the control circuit 100. The functional blocks shown in FIG. 2 may be implemented by hardware or may be implemented by software.

The control circuit 100 includes a drive control unit 110, an external charging control unit 120 and storage units 130 and 140.

When a user carries out start-up operation on a start switch (not shown) for starting devices of the vehicle 5, the drive control unit 110 turns on the SMRs 22 and 24 in response to the start-up operation to start up the devices of the vehicle 5. Then, the drive control unit 110 sets torque request values on the basis of a user's acceleration operation amount, a vehicle speed, and the like, and controls the operation of the PCU 30 so that the MGs 41 and 42 output torques corresponding to the torque request values. By so doing, the driving state of the vehicle 5 is controlled to a state corresponding to user's intention. Hereinafter, control executed by the drive control unit 110 is also termed "drive control". Through the drive control, charging and discharging are carried out between the battery 10 and the PCU 30.

During drive control, the drive control unit 110 controls charging and discharging between the battery 10 and the PCU 30 so that a state quantity that indicates the state of charge (hereinafter, also simply referred to as "SOC") of the battery 10 falls within a drive control range from a control lower limit value α to a control upper limit value β. Note that, in the present embodiment, the "SOC" is the ratio of an actual amount of charge to the full charge capacity (FCC) of the battery 10, and is expressed in percentage (0 to 100%).

Each time startup operation is carried out (each trip), the drive control unit 110 acquires the battery voltage Vb at the time of the start-up operation, and calculates an initial value SOC(0) corresponding to the acquired battery voltage Vb using a map, or the like, that defines the correlation between Vb and SOC. In addition, the drive control unit 110 loads the full charge capacity FCC stored in the storage unit 140.

Then, the drive control unit 110 calculates an accumulated value ∫I of the battery current Ib during a trip, and calculates the SOC during drive control using the following mathematical expression (1).

$$\text{SOC} = \text{SOC}(0) + \int I / \text{FCC} \tag{1}$$

The drive control unit 110 controls the PCU 30 so that the SOC calculated in the mathematical expression (1) satisfies the following mathematical expression (2) during drive control.

$$\alpha \leq \text{SOC} \leq \beta \tag{2}$$

Note that the reason why the SOC during drive control is limited within the drive control range from α to β is to prevent degradation of the battery 10. That is, during drive control, the battery 10 is charged or discharged at a high rate, and, if such charging or discharging at a high rate is performed in the range SOC<α or in the range SOC>β, the battery 10 may degrade. In order to prevent such degradation, the SOC during drive control is limited to a value that ranges from α to β.

Next, the external charging control unit 120 will be described. When the external power supply 400 is connected to the connector 210, the external charging control unit 120 controls the charger 200 to charge (externally charge) the battery 10 with electric power from the external power supply 400.

The external charging control unit 120 includes a determining unit 121, a first charging unit 122, a second charging unit 123 and a calculating unit 124.

The determining unit 121 determines whether to carry out extended charging using the second charging unit 123. As will be described in detail later, extended charging is longer in time from a start of charging to a completion of charging than normal charging using the first charging unit 122. Therefore, the determining unit 121 determines whether to carry out extended charging from a result that takes into consideration the convenience of the user on the basis of the usage history, stop situation, and the like, of the vehicle 5. For example, when the last multiple consecutive histories indicate that a period of time from the start of charging to the next start-up operation is longer than or equal to a period of time required for extended charging or when the time at which the external power supply 400 is connected to the connector 210 falls within midnight hours and it is determined from navigation information, or the like, that the position at which the vehicle 5 is stopped is home, the determining unit 121 determines that it is possible to ensure a period of time required for extended charging without impairing the convenience of the user and then it is allowed to carry out extended charging.

When it is not allowed to carry out extended charging, normal charging is carried out using the first charging unit 122, Specifically, the first charging unit 122 turns on the SMRs 22 and 24 to start external charging, and completes external charging at the time when the SOC calculated on the basis of the battery voltage CCV during charging has reached the control upper limit value β. Thus, a variation ΔSOC1 in SOC through normal charging falls at or below the difference between the control lower limit value α and the control upper limit value β(=|α−β|).

On the other hand, when it is allowed to carry out extended charging, extended charging is carried out using the second charging unit 123. Extended charging is continued until the SOC increases from a predetermined charging start value (hereinafter, referred to as "SOCs") to a predetermined charging end value (hereinafter, "SOCe"). Here, the SOCs is set to a value that falls within a range lower than the control lower limit value α, and the SOCe is set to a value that falls within a range higher than the control upper limit value β. Thus, a variation ΔSOC2 in SOC through extended charging is the difference between the SOCs and the SOCe (=SOCe−SOCs), and is larger than the variation ΔSOC1 through normal charging.

Hereinafter, control executed by the second charging unit 123 will be described in detail. After the second charging unit 123 turns on the SMRs 22 and 24, the second charging unit 123 starts pre-charge discharging in which the DC/DC converter 91 and/or the PCU 30 are driven to discharge the battery 10 before starting extended charging. Then, the second charging unit 123 ends pre-charge discharging at the time when the SOC calculated from the battery voltage CCV has decreased to the SOCs.

During a predetermined period of time from the end of pre-charge discharging, the second charging unit 123 does not charge or discharge the battery 10 to establish the state of battery current Ib=0 (state where the battery voltage OCV may be detected).

After that, the second charging unit 123 controls the charger 200 to start extended charging, and ends extended charging at the time when the SOC calculated on the basis of the battery voltage CCV has reached the SOCe.

During a period of time from the end of extended charging, the second charging unit 123 does not charge or discharge the battery 10 to establish the state of battery current Ib=0 (state where the battery voltage OCV may be detected).

After that, the second charging unit 123 carries out post-charge discharging in which the DC/DC converter 91 and/or the PCU 30 are driven again to discharge the battery 10, Then, the second charging unit 123 ends post-charge discharging at the time when the SOC calculated from the battery voltage CCV has decreased to the control upper limit value β.

In this way, the second charging unit 123 starts extended charging after discharging the battery 10 until the SOC has decreased to the SOCs (<α), and ends extended charging at the time when the SOC has reached the SOCe (>β). After extended charging, the second charging unit 123 prepares for the future drive control by discharging the battery 10 until the SOC reaches the control upper limit value β.

Next, the calculating unit 124 will be described. While extended charging is being carried out, the calculating unit 124 calculates the full charge capacity FCC in the following procedure.

The calculating unit 124 acquires the battery voltage Vb, detected in a period from the end of pre-charge discharging to the start of extended charging (state of Ib=0), as the battery voltage OCVs at the time of the start of extended charging, and calculates the SOCso corresponding to the acquired OCVs using an OCV-SOC map (map that presets the correlation between OCV and SOC, see FIG. 3) prestored in the storage unit 130.

Similarly, the calculating unit 124 acquires the battery voltage Vb, detected during a period from the end of extended charging to the start of post-charge discharging (state of Ib=0), as the battery voltage OCVe at the time of the end of extended charging, and calculates the SOCeo corresponding to the acquired OCVe using the OCV-SOC map (see FIG. 3) prestored in the storage unit 130.

Here, the reason why the SOC at the time of the start of extended charging and the SOC at the time of the end of extended charging are calculated not on the basis of the CCV but on the basis of the OCV is to improve the calculation accuracy of SOC. That is, as described above, the CCV varies depending on the internal resistance R or the battery current Ib, so the calculation accuracy of SOC improves when the SOC is calculated on the basis of the OCV as compared with when the SOC is calculated on the basis of the CCV.

In addition, the calculating unit 124 calculates an accumulated value ∫Iin of the battery current Ib during extended charging. The accumulated value ∫Iin corresponds to the amount of charge flowing into the battery 10 during extended charging.

Then, the calculating unit 124 calculates the variation ΔSOC2 using the following mathematical expression (3). Furthermore, the calculating unit 124 calculates the full charge capacity FCC using the following mathematical expression (4).

$$\Delta SOC2 = SOCeo - SOCso \tag{3}$$

$$FCC = \{100/\Delta SOC2\} \times \int Iin \tag{4}$$

That is, the calculating unit 124 multiplies the ratio of the SOC maximum value to ΔSOC2 (=100/ΔSOC2) by the accumulated value ∫Iin to estimate the amount of charge corresponding to the SOC maximum value, that is, the full charge capacity FCC.

The calculating unit 124 stores the obtained full charge capacity FCC in the storage unit 140. The drive control unit 110 loads the full charge capacity FCC stored in the storage unit 140 in each trip, and uses the loaded full charge capacity FCC to calculate the SOC during drive control (see the above described mathematical expression (1)).

Figure 3:
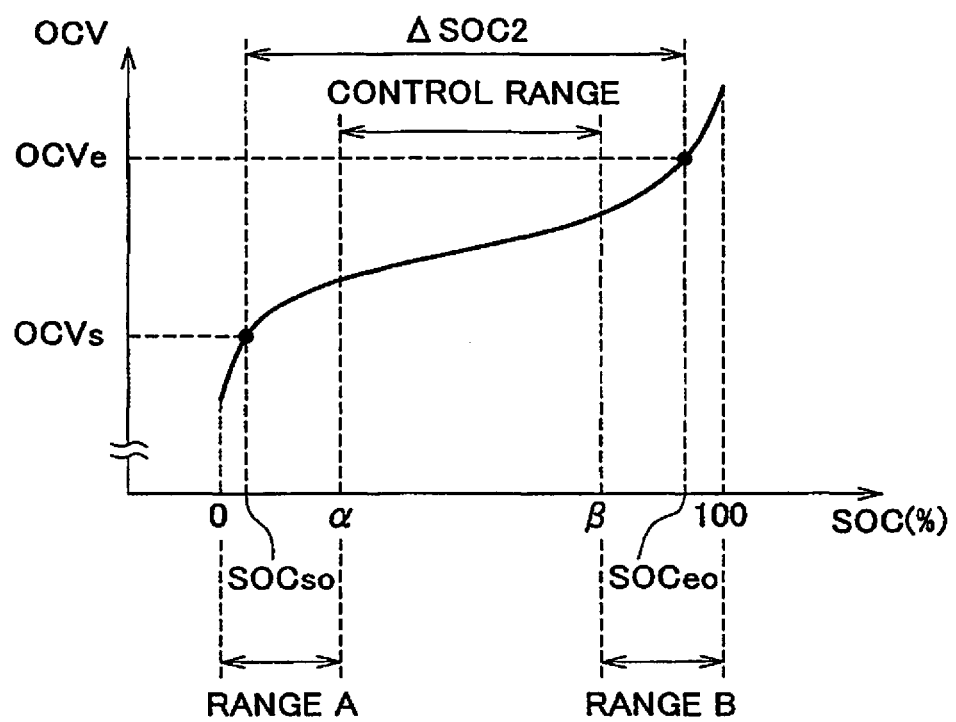
FIG. 3 is a graph that shows an OCV-SOC map and a method of calculating a variation amount $\Delta SOC2$.

FIG. 3 is a graph that shows the OCV-SOC map and a method of calculating the variation ΔSOC2 using the OCV-SOC map.

The storage unit 130 prestores the OCV-SOC map shown in FIG. 3. As is apparent from FIG. 3, the OCV increases as the SOC increases; however, in the range A in which SOC<α and the range B in which SOC>β, the slope of the OCV (variation in OCV per unit variation in SOC) is larger than that in the drive control range in which α≤SOC≤β. In other words, in the range A and the range B, the variation in SOC per unit variation in OCV is smaller than that in the drive control range. Note that the OCV-SOC map shown in FIG. 3 obtains the OCV-SOC characteristic of the battery 10 through an experiment, or the like, in advance and prestores the OCV-SOC characteristic of the battery 10.

The calculating unit 124 uses the OCV-SOC map to calculate the SOCso corresponding to the OCVs and the SOCeo corresponding to the OCVe, and calculates the difference between the SOCso and the SOCeo as the variation ΔSOC2. Here, the SOCso and the SOCeo are respectively included in the ranges A and B in which the variation in SOC per unit variation in OCV is small, Therefore, even if the OCVs or the OCVe contains an error, the SOCso or the SOCeo is a value close to a true value.

Figure 4A:
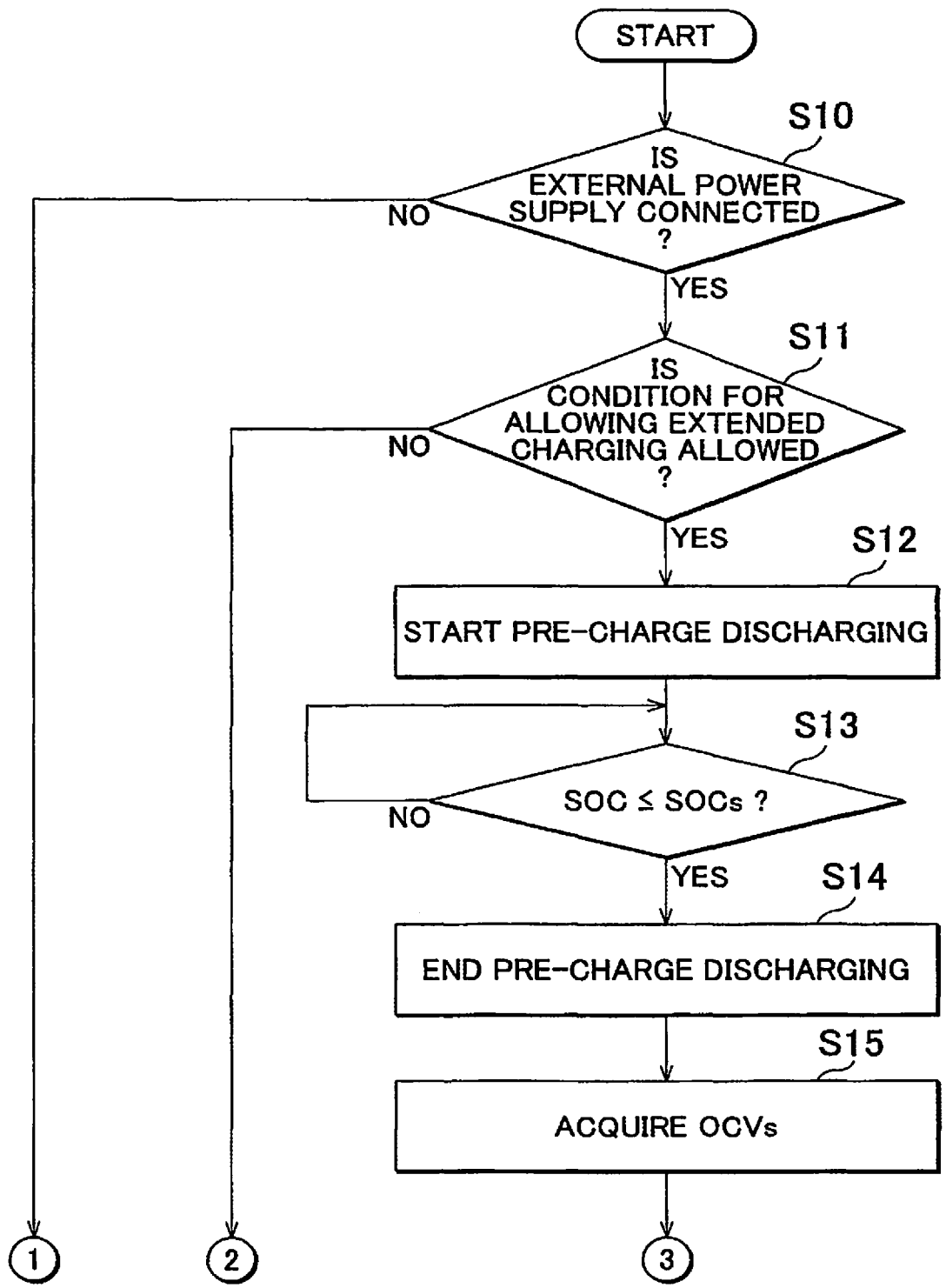
FIG. 4A is a flowchart that shows the procedure of the control circuit.
Figure 4B:
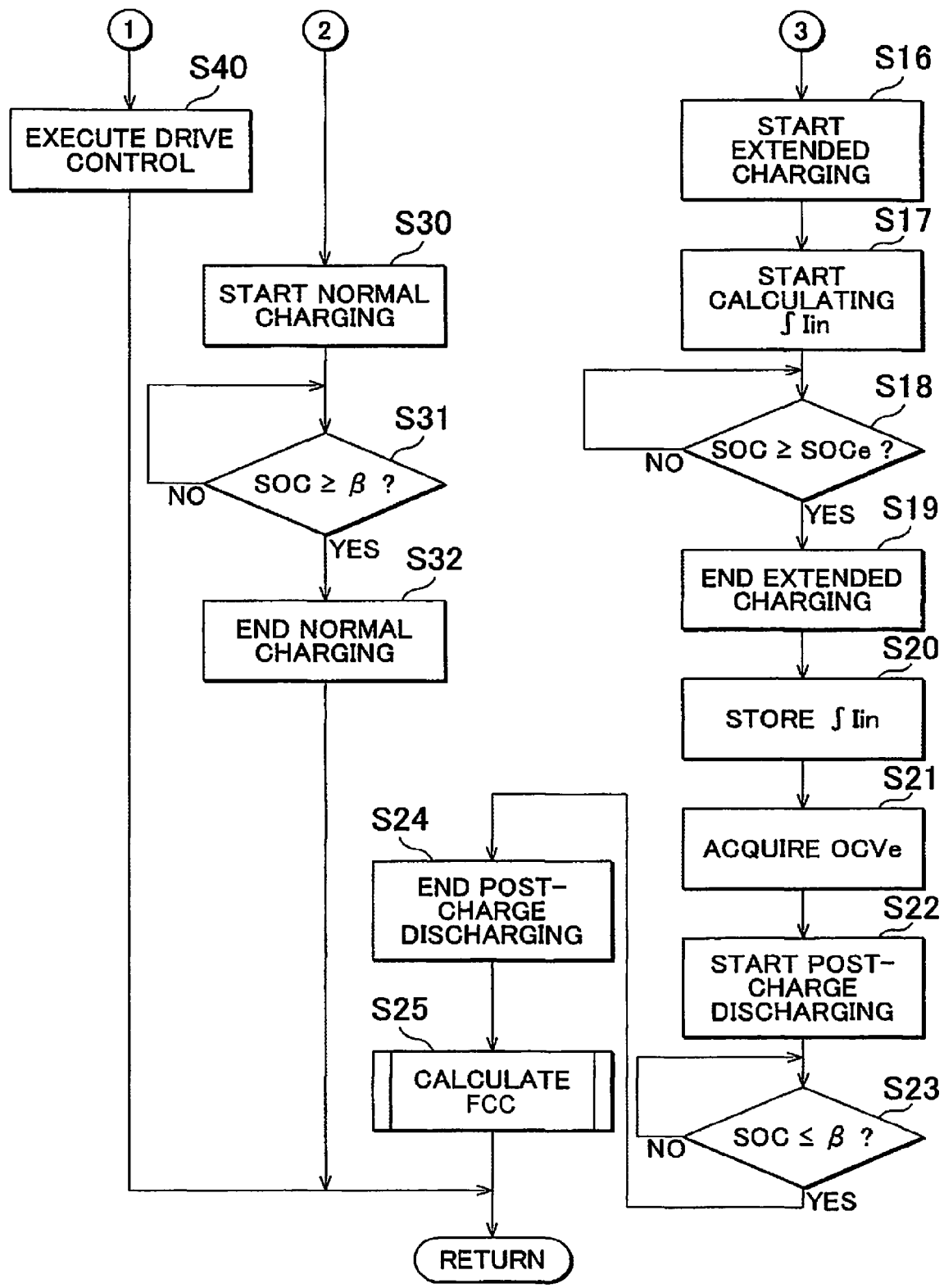
FIG. 4B is a flowchart that shows the procedure of the control circuit.

FIG. 4A and FIG. 4B are a flowchart that shows the procedure for implementing the functions of the above described control circuit 100. Steps (hereinafter, step is abbreviated as "S") of the flowchart described below may be implemented by hardware as described above or may be implemented by software.

In S10, the control circuit 100 determines whether the external power supply 400 is connected to the connector 210. When affirmative determination is made (YES in S10), the process proceeds to S11; whereas, when negative determination is made (NO in S10), the process proceeds to S40.

In S11, the control circuit 100 determines whether a condition for allowing extended charging is satisfied. The above determination is made in consideration of the convenience of the user on the basis of the usage history of the vehicle 5 as described above. When affirmative determination is made (YES in S11), the process proceeds to S12; whereas, when negative determination is made (NO in S11), the process proceeds to S30.

In S12, the control circuit 100 starts pre-charge discharging. In S13, the control circuit 100 determines whether the SOC calculated on the basis of the CCV is lower than or equal to the SOCs. When affirmative determination is made (YES in S13), the process proceeds to S14; whereas, when negative determination is made (NO in S13), the process returns to S13 to continue pre-charge discharging.

In S14, the control circuit 100 ends pre-charge discharging. In S15, the control circuit 100 acquires and stores the OCVs before starting extended charging.

In S16, the control circuit 100 starts extended charging. In S17, the control circuit 100 starts calculating an accumulated value ∫Iin of the battery current Ib during extended charging.

In S18, the control circuit 100 determines whether the SOC calculated on the basis of the CCV is higher than or equal to the SOCe. When affirmative determination is made (YES in S18), the process proceeds to S19; whereas, when negative determination is made (NO in S18), the process returns to S18 to continue extended charging.

In S19, the control circuit 100 ends extended charging. In S20, the control circuit 100 ends calculating the accumulated value ∫Iin and stores the accumulated value ∫Iin. In S21, the control circuit 100 acquires and stores the OCVe before starting post-charge discharging.

In S22, the control circuit 100 starts post-charge discharging. In S23, the control circuit 100 determines whether the SOC calculated on the basis of the CCV is lower than or equal to the control upper limit value β. When affirmative determination is made (YES in S23), the process proceeds to S24; whereas, when negative determination is made (NO in S23), the process returns S23 to continue post-charge discharging.

In S24, the control circuit 100 ends post-charge discharging. In S25, the control circuit 100 executes process of calculating the full charge capacity FCC. Note that the details of the process will be described with reference to FIG. 5.

In S30, the control circuit 100 starts normal charging. In S31, the control circuit 100 determines whether the SOC calculated on the basis of the CCV is higher than or equal to the control upper limit value β. When affirmative determination is made (YES in S31), the process proceeds to S32; whereas, negative determination is made (NO in S31), the process returns to S31 to continue normal charging. In S32, the control circuit 100 ends normal charging.

Figure 5:
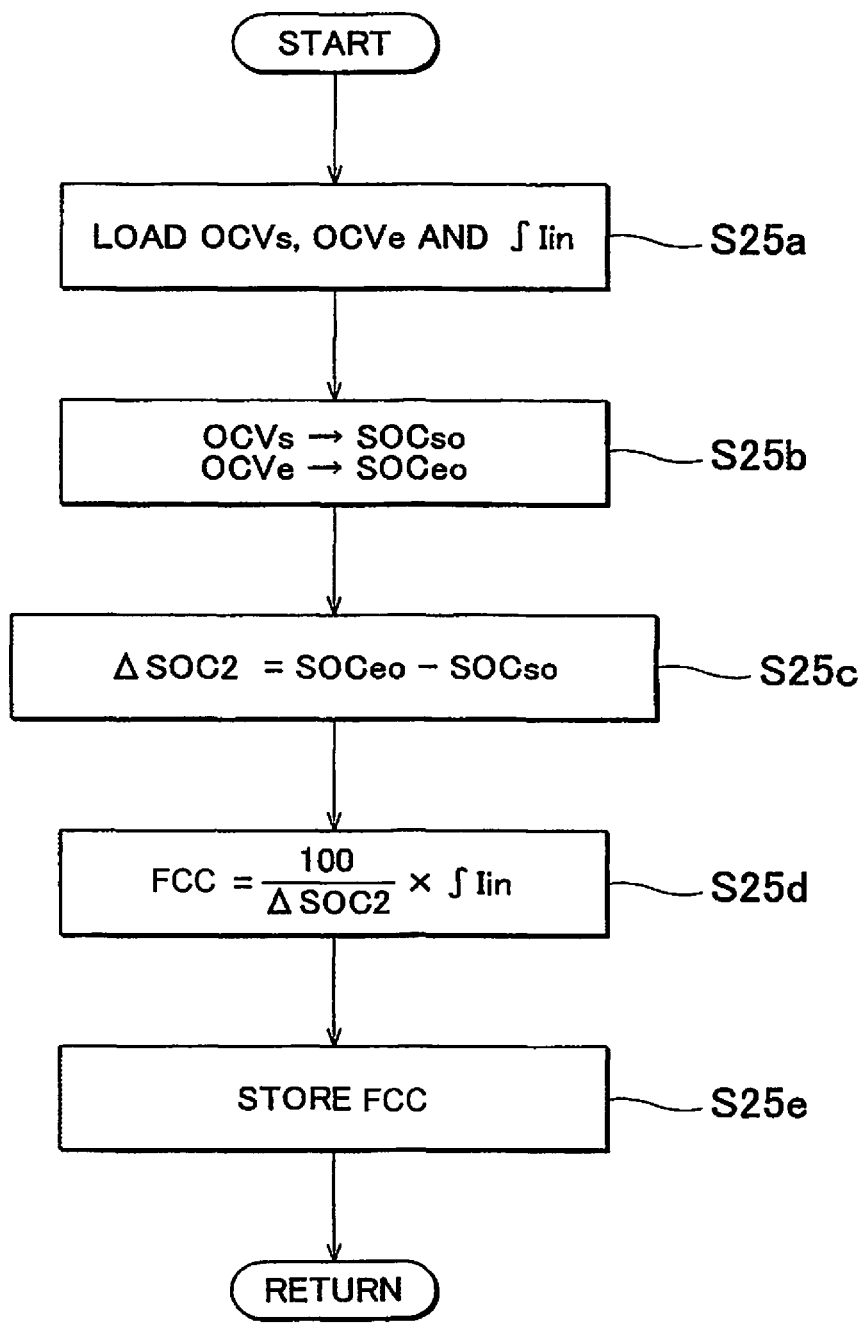
FIG. 5 is a flowchart that shows the procedure of calculating a full charge capacity FCC.

In S40, the control circuit 100 executes the above described drive control. FIG. 5 is a flowchart that shows the detailed procedure of the process (the process of calculating the full charge capacity FCC) in S25 of FIG. 4B.

In S25a, the control circuit 100 loads the battery voltages OCVs and OCVe and the accumulated value ∫Iin stored in the processes of S15, S20 and S21 of FIG. 4A and FIG. 4B.

In S25b, the control circuit 100 calculates the SOCso corresponding to the battery voltage OCVs and the SOCeo corresponding to the battery voltage OCVeo using the above described OCV-SOC map shown in FIG. 3.

In S25c, the control circuit 100 calculates the variation ΔSOC2 using the above described mathematical expression (3). In S25d, the control circuit 100 calculates the full charge capacity FCC using the above described mathematical expression (4). In S25e, the control circuit 100 stores the calculated full charge capacity FCC. The full charge capacity FCC stored in this process is loaded during the subsequent drive control, and is used to calculate the SOC (see the above described mathematical expression (1)).

Figure 6:
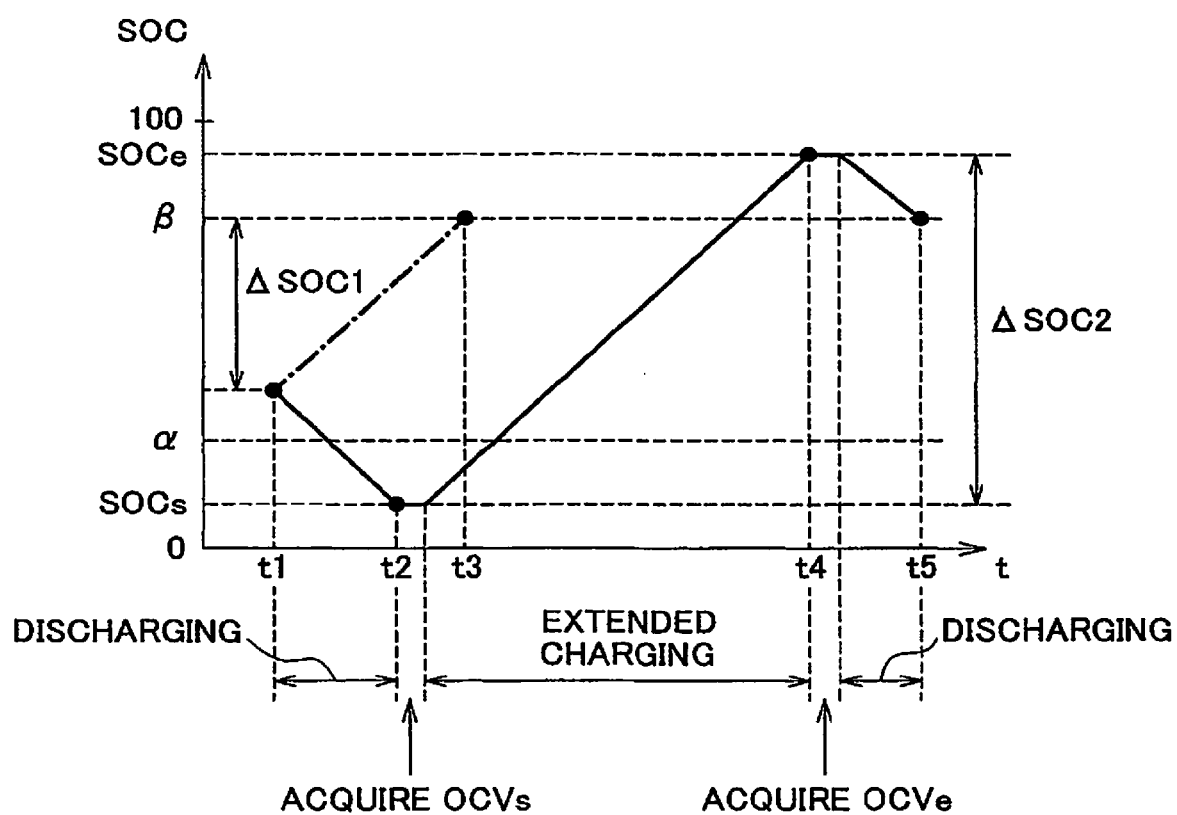
FIG. 6 is a graph that shows a variation in SOC over time during external charging.

FIG. 6 shows a variation in SOC over time during external charging (extended charging, normal charging). In FIG. 6, the solid line indicates a variation in SOC over time during extended charging, and the alternate long and short dashes line indicates a variation in SOC over time during normal charging.

When the external power supply 400 is connected to the connector 210 at time t1, charging is started at time t1 and charging is ended at time t3 at which the SOC has reached β in normal charging. Thus, the SOC variation ΔSOC1 through normal charging is smaller than or equal to the width of the drive control range (=β−α).

In contrast to this, in extended charging, pre-charge discharging is started at time t1, and pre-charge discharging is ended at time t2 at which the SOC has decreased to the SOCs lower than α. After that, extended charging is started as a predetermined period of time elapses, and extended charging is ended at time t4 at which the SOC has reached to the SOCe higher than β. After that, post-charge discharging is started as a predetermined period of time elapses, and post-charge discharging is ended at time t5 at which the SOC has decreased to β. By so doing, a series of controls of pre-charge discharging, extended charging and post-charge discharging end.

In the present embodiment, as shown in the above described mathematical expression (4), the full charge capacity FCC is calculated using FCC={100/ΔSOC2}×∫Iin.

When the full charge capacity FCC is calculated by the above method, the ΔSOC2 needs to be sufficiently ensured. That is, ∫Iin is calculated by accumulating the output from the current sensor 16, so ∫Iin contains the influence of an error of the current sensor 16. In addition, the ΔSOC2 is calculated using the output from the voltage sensor 14, so the ΔSOC2 contains the influence of an error of the voltage sensor 14. Therefore, when the ΔSOC2 is small, the amplifying rate of ∫Iin (=100/ΔSOC2) at the time of calculating the FCC increases, and an error contained in the FFC is also amplified accordingly.

In consideration of this point, in the present embodiment, the variation ΔSOC2 is extended as compared with during normal charging to thereby improve the calculation accuracy of the FCC.

For example, in the case where ∫Iin contains an error of ±5%, if the ΔSOC2 is set to 50% (value of the level during normal charging), an error contained in the FCC is ±5%×(100%/50%)=±10%; however, by extending the ΔSOC2 to 80%, an error contained in the FCC may be ±5%×(100%/80%)=±6.25%, so an error contained in the FCC may be reduced.

In addition, in the present embodiment, the ranges A and B (see FIG. 3) in which the variation in SOC per unit variation in OCV is small are used to calculate the SOCso at the time of the start of extended charging and the SOCeo at the time of the end of extended charging. Therefore, even when an error of the voltage sensor 14 is contained in the OCVs or OCVe, an error of the SOCso or SOCeo due to that error may be suppressed to an extremely small value. By so doing, the calculation accuracy of the ΔSOC2 improves, so the calculation accuracy of the FCC improves.

In this way, by calculating the full charge capacity FCC during extended charging in which the SOC variation is extended, it is possible to accurately calculate the full charge capacity FCC. The FCC accurately calculated during extended charging in this way is stored, and the SOC is calculated using the stored full charge capacity FCC during drive control (see the mathematical expression (1)). Thus, it is possible to accurately calculate the SOC during drive control.

The above described embodiment is just illustrative and not restrictive. The scope of the invention is defined by the appended claims rather than the above description. The scope of the invention is intended to encompass all modifications within the scope of the appended claims and equivalents thereof.

The invention claimed is:

1. A control device for a vehicle, the vehicle including a battery, an auxiliary load, an electric power controller, and a charger, the electrical power controller being configured to control electric power exchanged between the battery and the auxiliary load, the charger being configured to carry out external charging in which a power supply outside the vehicle is used to charge the battery, the control device comprising:
   a first controller configured to, during drive control of the vehicle, control the electric power controller so that a state of charge that is a ratio of an actual amount of charge to a full charge capacity of the battery falls within a predetermined range;
   a second controller configured to, when the power supply is connected to the vehicle, control the electric power controller and the charger so as to carry out extended charging in which a variation in the state of charge during the external charging is larger than a width of the predetermined range that is a control range from a control lower limit value to a control upper limit value during drive control; and
   a calculator configured to calculate the full charge capacity by multiplying a ratio of a maximum value of the state of charge, which is a value of 100 percent, to a variation in the state of charge during the extended charging by an accumulated value of current flowing into the battery from a start of the extended charging;
   wherein when the power supply is connected to the vehicle, the second controller carries out first discharging in which the battery is discharged until the state of charge decreases to a first state of charge that falls within a first range lower than a lower limit value of the predetermined range, starts the extended charging after the first discharging is ended, and ends the extended charging at the time when the state of charge has reached a second state of charge that falls within a second range higher than an upper limit value of the predetermined range;
   wherein the battery has a characteristic such that a variation in the state of charge with respect to a unit variation in voltage of the battery in the first and second ranges is smaller than a variation in voltage of the state of charge with respect to a unit variation in voltage of the battery in the predetermined range,
   wherein the control device further comprises a voltage sensor detecting a voltage of the battery, and
   wherein the calculator calculates a state of charge at the time when the extended charging is started on the basis of an output from the voltage sensor at the time when the extended charging is started, calculates a state of charge at the time when the extended charging is ended on the basis of an output from the voltage sensor at the time when the extended charging is ended, and calculates a difference between the calculated state of charge at the time when the extended charging is started and the calculated state of charge at the time when the extended charging is ended as a variation in the state of charge during the extended charging.

2. The control device according to claim 1, wherein the second controller carries out second discharging in which, after the extended charging is ended, the battery is discharged so that the state of charge falls within the predetermined range.

3. The control device according to claim 1, wherein the second controller establishes a state where no current is flowing through the battery during a first period after the first discharging is ended and before the extended charging is started, and establishes a state where no current is flowing through the battery during a second period after the extended charging is ended and before the second discharging is started,
the second controller further comprising a correlation storage prestoring a voltage of the battery and the state of charge in a state where no current is flowing through the battery, wherein
the calculator calculates a state of charge corresponding to an output from the voltage sensor in the first period using the correlation as a state of charge at the time when the extended charging is started, calculates a state of charge corresponding to an output from the voltage sensor in the second period using the correlation as a state of charge at the time when the extended charging is ended, and calculates a variation in the state of charge during the extended charging.

4. The control device according to claim 1, wherein the second controller determines whether it is allowed to carry out the extended charging on the basis of a usage history of the vehicle when the power supply is connected to the vehicle, carries out the extended charging when it is determined that it is allowed to carry out the extended charging, and carries out normal charging in which the external charging is ended at the time point at which the state of charge has reached an upper limit value of the predetermined range when it is determined that it is not allowed to carry out the extended charging.

5. The control device according to claim 1, wherein the second controller determines whether it is allowed to carry out the extended charging when time at which the power supply is connected to the vehicle falls within midnight hours and it has been detected that a position at which the vehicle is stopped is a home of a driver of the vehicle, carries out the extended charging when it is determined that it is allowed to carry out the extended charging, and carries out normal charging in which the external charging is ended at the time when the state of charge has reached an upper limit value of the predetermined range when it is determined that it is not allowed to carry out the extended charging.

6. The control device according to claim 1, further comprising:
a capacity storage storing the full charge capacity calculated by the calculator, wherein the first controller uses the full charge capacity stored in the capacity storage to calculate the state of charge during the drive control.

7. A control method for a vehicle, the vehicle including a battery, a load, an electric power controller, and a charger, the electrical power controller being configured to control electric power exchanged between the battery and the load, the charger being configured to carry out external charging in which a power supply outside the vehicle is used to charge the battery, the method comprising:
during drive control of the vehicle, controlling the electric power controller so that a state or charge that is a ratio of an actual amount of charge to a full charge capacity of the battery falls within a predetermined range;
when the power supply is connected to the vehicle, controlling the electric power controller and the charger so as to carry out extended charging in which a variation in the state of charge during the external charging is between a predetermined charging start value and a predetermined charging end value, wherein the predetermined charging start value is lower than the control lower limit value, and the predetermined charging end value is higher than the control upper limit value; and
calculating the full charge capacity by multiplying a ratio of a maximum value of the state of charge, which is a value of 100 percent, to a variation in the state of charge during the extended charging by an amount of charge flowing into the battery from a start of the extended charging;
wherein when the power supply is connected to the vehicle, the method includes carrying out first discharging in which the battery is discharged until the state of charge decreases to a first state of charge that falls within a first range lower than a lower limit value of the predetermined range, starting the extended charging after the first discharging is ended, and ending the extended charging at the time when the state of charge has reached a second state of charge that falls within a second range higher than an upper limit value of the predetermined range;
wherein the battery has a characteristic such that a variation in the state of charge with respect to a unit variation in voltage of the battery in the first and second ranges is smaller than a variation in voltage of the state of charge with respect to a unit variation in voltage of the battery in the predetermined range; and
wherein the method further comprises:
detecting a voltage of the battery;
calculating a state of charge at the time when the extended charging is started on the basis of the detected voltage of the battery at the time when the extended charging is started;
calculating a state of charge at the time when the extended charging is ended on the basis of the detected voltage of the battery at the time when the extended charging is ended; and
calculating a difference between the calculated state of charge at the time when the extended charging is started and the calculated state of charge at the time when the extended charging is ended as a variation in the state of charge during the extended charging.

* * * * *